(12) United States Patent
Chen et al.

(10) Patent No.: US 8,829,647 B2
(45) Date of Patent: Sep. 9, 2014

(54) HIGH TEMPERATURE ALD PROCESS FOR METAL OXIDE FOR DRAM APPLICATIONS

(71) Applicant: Intermolecular, Inc., San Jose, CA (US)

(72) Inventors: Hanhong Chen, Milpitas, CA (US);
Edward Haywood, San Jose, CA (US);
Sandra Malhotra, Fort Collins, CO (US); Hiroyuki Ode, Higashihiroshima (JP)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/737,156

(22) Filed: Jan. 9, 2013

(65) Prior Publication Data

US 2014/0077337 A1    Mar. 20, 2014

Related U.S. Application Data

(63) Continuation of application No. 13/622,947, filed on Sep. 19, 2012.

(51) Int. Cl.
| | |
|---|---|
| *H01L 29/92* | (2006.01) |
| *C23C 16/455* | (2006.01) |
| *H01L 21/285* | (2006.01) |
| *H01L 49/02* | (2006.01) |

(52) U.S. Cl.
CPC .......... *H01L 29/92* (2013.01); *C23C 16/45525* (2013.01); *H01L 21/28562* (2013.01); *H01L 28/65* (2013.01); *H01L 28/75* (2013.01)
USPC ........... 257/532; 257/296; 257/303; 257/306; 257/516; 257/E29.345

(58) Field of Classification Search
USPC ................................................. 257/532–535
See application file for complete search history.

(56) References Cited

U.S. PATENT DOCUMENTS

| | | | | |
|---|---|---|---|---|
| 8,138,057    | B2 * | 3/2012  | Lee et al. ......... | 438/396 |
| 2007/0066012 | A1 * | 3/2007  | Ohtsuka et al. ..... | 438/250 |
| 2007/0128736 | A1 * | 6/2007  | Chang et al. ....... | 438/3   |
| 2010/0301406 | A1 * | 12/2010 | Ahn et al. ......... | 257/324 |
| 2011/0204475 | A1 * | 8/2011  | Rui et al. ......... | 257/532 |
| 2011/0222207 | A1 * | 9/2011  | Lee et al. ......... | 361/322 |
| 2012/0021587 | A1 * | 1/2012  | Vaartstra et al. ... | 438/396 |
| 2012/0092807 | A1 * | 4/2012  | Popovici et al. .... | 361/313 |

* cited by examiner

*Primary Examiner* — Angel Roman

(57) ABSTRACT

A first electrode layer for a Metal-Insulator-Metal (MIM) DRAM capacitor is formed wherein the first electrode layer contains a conductive metal oxide formed using a high temperature, low pressure ALD process. The high temperature ALD process results in a layer with enhanced crystallinity, higher density, reduced shrinkage, and lower carbon contamination. The high temperature ALD process can be used for either or both the bottom electrode and the top electrode layers.

15 Claims, 10 Drawing Sheets

HIGH TEMPERATURE ALD PROCESS FOR METAL OXIDE FOR DRAM APPLICATIONS

CROSS-REFERENCE TO RELATED APPLICATIONS

This is a Continuation Application of U.S. patent application Ser. No. 13/622,947, filed on Sep. 19, 2012, which is herein incorporated by reference for all purposes.

This document relates to the subject matter of a joint research agreement between Intermolecular, Inc. and Elpida Memory, Inc.

FIELD OF THE DISCLOSURE

The present disclosure relates generally to the use of non-noble metal electrodes in capacitors used in Dynamic Random Access Memory (DRAM) devices.

BACKGROUND OF THE DISCLOSURE

Dynamic Random Access Memory utilizes capacitors to store bits of information within an integrated circuit. A capacitor is formed by placing a dielectric material between two electrodes formed from conductive materials. A capacitor's ability to hold electrical charge (i.e., capacitance) is a function of the surface area of the capacitor plates A, the distance between the capacitor plates d (i.e. the physical thickness of the dielectric layer), and the relative dielectric constant or k-value of the dielectric material. The capacitance is given by:

$$C = \kappa \varepsilon_o \frac{A}{d} \quad \text{(Eqn. 1)}$$

where $\varepsilon_o$ represents the vacuum permittivity.

The dielectric constant is a measure of a material's polarizability. Therefore, the higher the dielectric constant of a material, the more electrical charge the capacitor can hold. Therefore, for a given desired capacitance, if the k-value of the dielectric is increased, the area of the capacitor can be decreased to maintain the same cell capacitance. Reducing the size of capacitors within the device is important for the miniaturization of integrated circuits. This allows the packing of millions (mega-bit (Mb)) or billions (giga-bit (Gb)) of memory cells into a single semiconductor device. The goal is to maintain a large cell capacitance (generally ~10 to 25 fF) and a low leakage current (generally $<10^{-7}$ A cm$^{-2}$). The physical thickness of the dielectric layers in DRAM capacitors could not be reduced unlimitedly in order to avoid leakage current caused by tunneling mechanisms which exponentially increases as the thickness of the dielectric layer decreases.

Traditionally, SiO$_2$ has been used as the dielectric material and semiconducting materials (semiconductor-insulator-semiconductor [SIS] cell designs) have been used as the electrodes. The cell capacitance was maintained by increasing the area of the capacitor using very complex capacitor morphologies while also decreasing the thickness of the SiO$_2$ dielectric layer. Increases of the leakage current above the desired specifications have demanded the development of new capacitor geometries, new electrode materials, and new dielectric materials. Cell designs have migrated to metal-insulator-semiconductor (MIS) and now to metal-insulator-metal (MIM) cell designs for higher performance.

Typically, DRAM devices at technology nodes of 80 nm and below use MIM capacitors wherein the electrode materials are metals. These electrode materials generally have higher conductivities than the semiconductor electrode materials, higher work functions, exhibit improved stability over the semiconductor electrode materials, and exhibit reduced depletion effects. The electrode materials must have high conductivity to ensure fast device speeds. Representative examples of electrode materials for MIM capacitors are metals, conductive metal oxides, conductive metal silicides, conductive metal nitrides (i.e. TiN), or combinations thereof. MIM capacitors in these DRAM applications utilize insulating materials having a dielectric constant, or k-value, significantly higher than that of SiO$_2$ (k=3.9). For DRAM capacitors, the goal is to utilize dielectric materials with k values greater than about 20. Such materials are generally classified as high-k materials. Representative examples of high-k materials for MIM capacitors are non-conducting metal oxides, non-conducting metal nitrides, non-conducting metal silicates or combinations thereof. These dielectrics may also include additional dopant materials.

One class of high-k dielectric materials possessing the characteristics required for implementation in advanced DRAM capacitors are high-k metal oxide materials. Titanium oxide is a metal oxide dielectric material which displays significant promise in terms of serving as a high-k dielectric material for implementation in DRAM capacitors.

The dielectric constant of a dielectric material may be dependent upon the crystalline phase(s) of the material. For example, in the case of titanium oxide, the anatase crystalline phase of titanium oxide has a dielectric constant of approximately 40, while the rutile crystalline phase of titanium oxide can have a dielectric constant of approximately >80. Due to the higher-k value of the rutile-phase, it is desirable to produce titanium oxide based DRAM capacitors with the titanium oxide in the rutile-phase. The relative amounts of the anatase phase and the rutile phase can be determined from x-ray diffraction (XRD). From Eqn. 1 above, a titanium oxide layer in the rutile-phase could be physically thicker and maintain the desired capacitance. The increased physical thickness is important for lowering the leakage current of the capacitor. The anatase phase will transition to the rutile phase at high temperatures (>800 C). However, high temperature processes are undesirable in the manufacture of DRAM devices.

The crystal phase of an underlying layer can be used to influence the growth of a specific crystal phase of a subsequent material if their crystal structures are similar and their lattice constants are similar. This technique is well known in technologies such as epitaxial growth. The same concepts have been extended to the growth of thin films where the underlying layer can be used as a "template" to encourage the growth of a desired phase over other competing crystal phases.

Conductive metal oxides, conductive metal silicides, conductive metal nitrides, conductive metal carbides, or combinations thereof are examples of other classes of materials that may be suitable as DRAM capacitor electrodes. Generally, transition metals and their conductive binary compounds form good candidates as electrode materials. The transition metals exist in several oxidation states. Therefore, a wide variety of compounds are possible. Different compounds may have different crystal structures, electrical properties, etc. It is important to utilize the proper compound for the desired application.

In one example, molybdenum has several binary oxides of which MoO$_2$ and MoO$_3$ are two examples. These two oxides of molybdenum have different properties. MoO$_2$ has shown great promise as an electrode material in DRAM capacitors. $MoO_2$ has a distorted rutile crystal structure and serves as an acceptable template to promote the deposition of the rutile-phase of $TiO_2$ as discussed above. $MoO_2$ also has a high work function (can be >5.0 eV depending on process history) which helps to minimize the leakage current of the DRAM device. However, oxygen-rich phases ($MoO_{2+x}$) degrade the performance of the $MoO_2$ electrode because they do not promote the deposition of the rutile-phase of $TiO_2$. For example, $MoO_3$ (the most oxygen-rich phase) has an orthorhombic crystal structure.

Generally, a deposited thin film may be amorphous, crystalline, or a mixture thereof. Furthermore, several different crystalline phases may exist. Therefore, processes (both deposition and post-treatment) must be developed to maximize the formation of crystalline $MoO_2$ and to minimize the presence of $MoO_2$, phases. Deposition processes and post-treatment processes in a reducing atmosphere have been developed that allow crystalline $MoO_2$ to be used as the first electrode (i.e. bottom electrode) in MIM DRAM capacitors with titanium oxide or doped-titanium oxide high-k dielectric materials. Examples of the post-treatment process are further described in U.S. application Ser. No. 13/084,666 filed on Apr. 12, 2011, entitled "METHOD FOR FABRICATING A DRAM CAPACITOR" which is incorporated herein by reference. Other conductive metal oxides that may be used as a template for the rutile phase of titanium oxide include the conductive compounds of molybdenum oxide, tungsten oxide, ruthenium oxide, iron oxide, iridium oxide, chromium oxide, manganese oxide, tin oxide, cobalt oxide, or nickel oxide.

As used herein, the phrase "conductive metal oxide" will be understood to include the typical stoichiometric metal oxides as well as conductive non-stoichiometric metal oxides wherein the oxygen to metal ratio is not equal to the stoichiometric ratio. As an example, "conductive molybdenum oxide" will include $MoO_2$ as well as those conductive molybdenum oxides wherein the oxygen to metal ratio is slightly greater than or slightly less than 2. Those skilled in the art will understand that metal-oxygen compounds that are slightly off of the stoichiometric ratio will also be conductive and will fall within the scope of the present disclosure. As used herein, the phrase "conductive metal oxide" will be understood to include metal oxide materials having a resistivity of less than about 10 $\Omega$cm.

The use of conductive metal oxide as an electrode layer (e.g. first electrode and/or second electrode) has a number of additional issues. The layers exhibit high shrinkage during subsequent annealing treatments. The layers exhibit high surface roughness when deposited at higher temperatures. The layers can contain high levels of carbon contamination.

Therefore, there is a need to develop processes that allow the formation of a conductive metal oxide electrode layers (e.g. first electrode and/or second electrode) that can serve as a template for the rutile phase of titanium oxide (e.g. first electrode embodiments), has a low shrinkage, has low surface roughness, and has low carbon contamination.

SUMMARY OF THE DISCLOSURE

In some embodiments, a conductive metal oxide first electrode layer is formed as part of a MIM DRAM capacitor stack. In some embodiments, a conductive metal oxide layer is formed as part of a bilayer first electrode of a MIM DRAM capacitor stack. The conductive metal oxide first electrode layer is formed using a high temperature ALD process at low pressure.

In some embodiments, a conductive metal oxide second electrode layer is formed as part of a MIM DRAM capacitor stack. In some embodiments, a conductive metal oxide layer is formed as part of a bilayer second electrode of a MIM DRAM capacitor stack. The conductive metal oxide second electrode layer is formed using a high temperature ALD process at low pressure.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present disclosure can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

It must be noted that as used herein and in the claims, the singular forms "a," "and" and "the" include plural referents unless the context clearly dictates otherwise. Thus, for example, reference to "a layer" also includes two or more layers, and so forth. As an example, those skilled in the art will understand that an "electrode layer" may include a single layer or may include a "bilayer" of two materials.

As discussed previously, it is possible to implement a conductive metal oxide as the first electrode layer in a DRAM capacitor stack. Conductive metal oxide materials of interest are able to serve as a template and promote the high k crystalline phases of metal oxide dielectric materials formed on the surface of these metal oxide materials. Some conductive metal oxide materials can promote the high k rutile phase of titanium oxide. Examples of such conductive metal oxides include the conductive compounds of molybdenum oxide, tungsten oxide, ruthenium oxide, iridium oxide, chromium oxide, manganese oxide, or tin oxide. Specific conductive metal oxide materials of interest are the conductive metal compounds of molybdenum oxide, ruthenium oxide, manganese oxide, tungsten oxide, and tin oxide. Typically, conductive metal oxide materials are deposited using atomic layer deposition (ALD) processes. Exemplary conductive metal oxide ALD precursors include alkyls, alkylamides, aryls, alkoxides, carbonyls, b-diketonates, cyclopentadienyls, amines, amido complexes, amidinates, halides, and the like. ALD processes were evaluated at temperatures between about 180 C and about 240 C and at pressures of about 2.5 torr. At these temperatures and pressures, the deposition rate was typically between about 0.5 A/cycle and about 2.0 A/cycle. However, conductive metal oxide materials formed from ALD processes using these process parameters generally exhibited low density, high shrinkage after annealing, high surface roughness, and higher carbon contamination.

Figure 1:
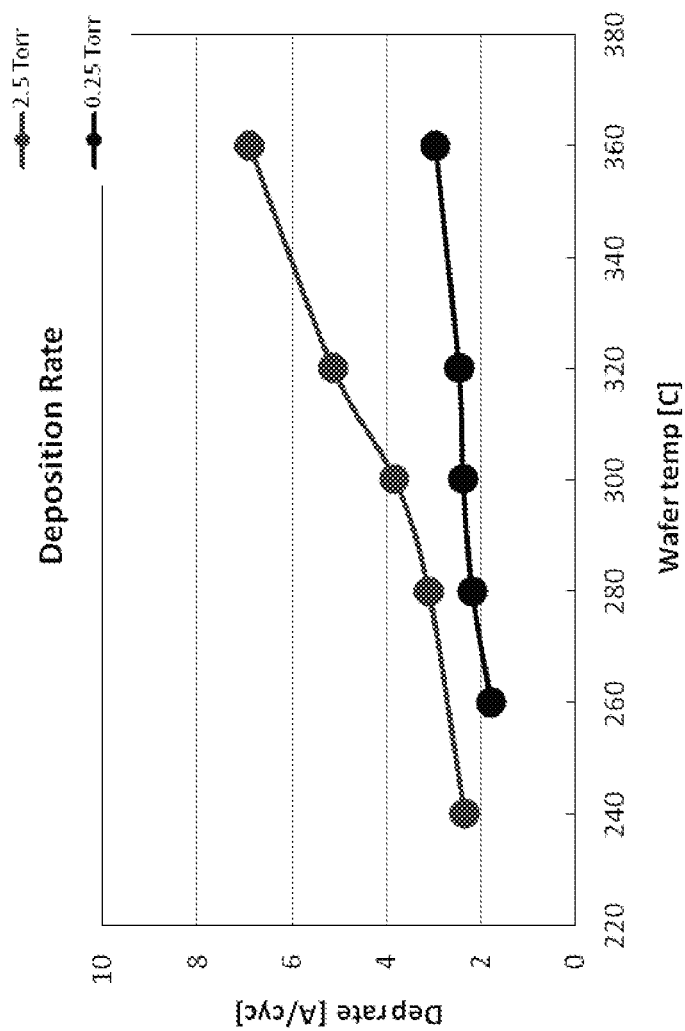
FIG. 1 presents data for deposition rate versus temperature at two different pressures.

To address the issues discussed previously, the temperature of the ALD deposition can be increased. This results in conductive metal oxide layers which exhibit higher density and lower shrinkage after annealing. However, since the metal organic precursors do not exhibit perfect ALD behavior (e.g. they are not truly self-limiting), there is a chemical vapor deposition (CVD) component to the deposition that can be observed at higher temperatures. The influence of the CVD component to the deposition can be decreased by lowering the pressure during the deposition. The magnitude of the CVD component will decrease with lowering pressure while the ALD component will be unaffected. The deposition of conductive molybdenum oxide will be used as an example. The data presented herein was obtained using a metal organic molybdenum precursor wherein the molybdenum was present in the +4 valence state. The data obtained were better than those obtained using metal organic molybdenum precursors wherein the molybdenum was present in either the +2 or +6 valence states. Those skilled in the art will understand that this can be extended to the deposition of the other conductive metal oxides listed previously. This is illustrated in FIG. 1 wherein the deposition rate of conductive molybdenum oxide increases from about 2.5 A/cycle at a temperature of 240 C and a pressure of 2.5 Torr to about 7.0 A/cycle at a temperature of 360 C and a pressure of 2.5 Torr. In contrast, the deposition rate of conductive molybdenum oxide increases from about 1.8 A/cycle at a temperature of 260 C and a pressure of 0.25 Torr to about 3.0 A/cycle at a temperature of 360 C and a pressure of 0.25 Torr. The lower pressure has allowed the CVD component of the deposition to be suppressed.

The conductive molybdenum oxide layers deposited at 360 C and 0.25 Torr pressure exhibit smooth surface roughness. For example, in some embodiments, a surface roughness of about 10 A was measured for a conductive molybdenum oxide layer with a thickness of about 10 nm formed on a titanium nitride base layer (i.e. a bilayer electrode layer). This level of surface roughness for the first electrode layer is acceptable for advanced DRAM capacitor stacks.

Figure 2:
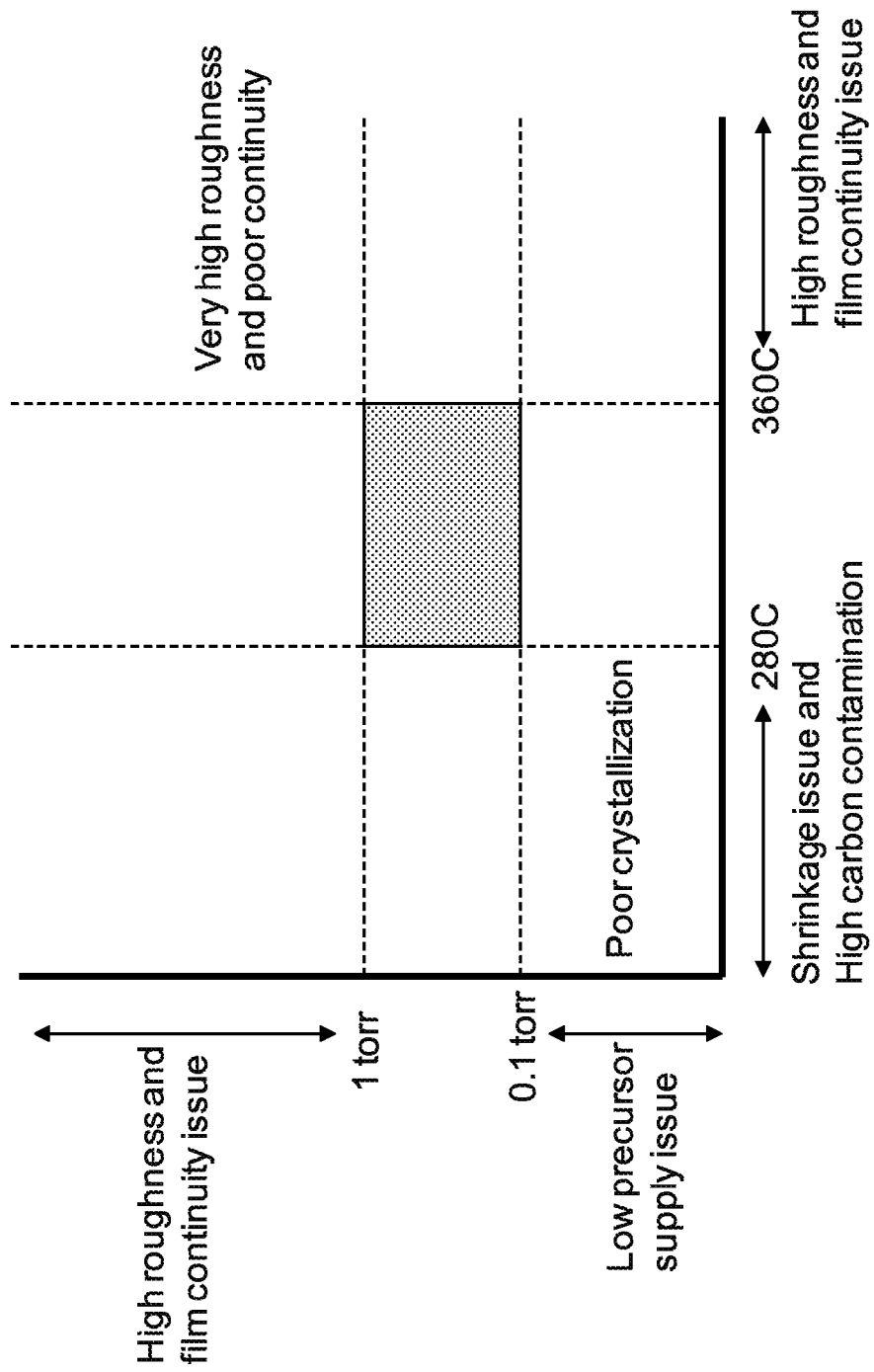
FIG. 2 presents a chart illustrating issues encountered in the pressure-temperature ALD process space and highlighting the region where films with acceptable quality may be produced.

The conductive molybdenum oxide layers deposited at 360 C and 0.25 Torr pressure exhibit reduced shrinkage after an anneal process. For example, in some embodiments, conductive molybdenum oxide layers deposited at 180 C and 2.5 Torr pressure exhibited a shrinkage of about 35% after an anneal process to crystallize the layer. The crystallization anneal process was at a temperature of about 450 C. Conductive molybdenum oxide layers deposited at 240 C and 2.5 Torr pressure exhibited a shrinkage of about 15% after an anneal process to crystallize the layer. Conductive molybdenum oxide layers deposited at 360 C and 0.25 Torr pressure exhibited a shrinkage of about 7% after an anneal process to crystallize the layer. FIG. 2 presents a chart illustrating issues encountered in the pressure-temperature ALD process space and highlighting the region where films with acceptable quality may be produced. At pressures greater than about 1.0 Torr, the films exhibit high roughness and may become discontinuous. At pressures greater than 1.0 Torr, the high roughness increased as the deposition temperature increased, leading to very high roughness at temperatures above about 360 C. At pressures below about 0.1 Torr, issues with precursor supply and pressure stability were encountered. Films deposited at the lower temperatures (i.e. <~2800) may exhibit poor crystallization, high shrinkage, and higher contamination. Films deposited at the higher temperatures (i.e. >~3600) may exhibit very high roughness and issues with film discontinuity were encountered. Therefore, the beneficial range is believed to be between about 0.1 Torr and 1.0 Torr in pressure and between about 280 C and 360 C in temperature. Films deposited in this range were smooth, continuous, exhibited low shrinkage, and exhibited low contamination. This data clearly indicate the benefits of the higher temperature and lower pressure deposition. After the crystallization anneal process, transmission electron microscopy (TEM) verified that the conductive molybdenum oxide layers were continuous, with no voids.

The goal of the crystallization anneal process is to convert a portion (e.g. more than 30% as measured by XRD) of the conductive molybdenum oxide layers to crystalline molybdenum oxide. As discussed previously, crystalline molybdenum oxide has a distorted rutile crystal structure and is effective at promoting the growth of the high k phase of dielectric materials such as the rutile phase of titanium oxide. The growth of rutile phase titanium oxide on crystallized molybdenum oxide deposited at a temperature of 360 C and at a pressure of 0.25 Torr has been confirmed. Capacitor stacks were formed to test the performance of the molybdenum oxide layers deposited at a temperature of 360 C and at a pressure of 0.25 Torr as part of the first electrode structure. The capacitor stacks included a titanium nitride base layer (i.e. a bilayer electrode layer), a conductive molybdenum oxide layer as part of the first electrode layer, a titanium oxide dielectric layer doped with aluminum, and a platinum second electrode layer. Capacitor stacks were formed wherein the conductive molybdenum oxide layer was formed at 240 C, 280 C, or 360 C. All capacitor stacks were formed at a pressure in the range of about 0.25 Torr to about 0.50 Torr. Table 1 presents data that compares the measured EOT values and the leakage current density for the various capacitor stacks. The data indicate that low values of EOT and the leakage current density (e.g. both are evidence of a high k value of the dielectric layer) can be obtained using a high temperature, low pressure deposition for the conductive molybdenum oxide portion of the first electrode layer.

TABLE 1

| Conductive molybdenum oxide deposition temperature (C.) | EOT (nm) | J at 1.0 V (A/cm$^2$) |
|---|---|---|
| 240 | 0.65 | 2.4E−7 |
| 280 | 0.60 | 3.00E−7 |
| 360 | 0.60 | 1.03E−7 |

In addition to the issues regarding the CVD component of the deposition at higher temperatures discussed previously, the reactivity of the reactant is also much more aggressive at higher deposition temperatures. Typically, ozone is used as a reactant for the deposition of metal oxides, used either as electrode layers or as dielectric layers. However, other reactants, such as water or oxygen, are also commonly used. When ozone is used as the reactant, concentrations between about 3% and about 20% are typical. However, at higher temperatures, such as 360 C, the higher concentrations of ozone are too aggressive and react with the precursor to form oxygen-rich metal oxide compounds (e.g. they form $MoO_{2+x}$ or $MoO_3$ in the case of molybdenum). As discussed previously, these compounds are undesirable. Additionally, the higher concentrations of ozone may react with the underlying titanium nitride to form titanium oxy-nitride compounds that degrade the performance of the first electrode structure and lead to increased leakage current.

To address these issues, ozone concentrations as low as 1% were employed to form the conductive metal oxide layer. Conductive molybdenum oxide will be used as an example. Capacitor stacks were formed to test the performance of the molybdenum oxide layers deposited at a temperature of 360 C, a pressure of 0.25 Torr, and an ozone concentration of 1% as part of the first electrode layer. The capacitor stacks included a titanium nitride base layer, a conductive molybdenum oxide layer as part of the first electrode layer, a titanium oxide dielectric layer doped with aluminum, and a platinum second electrode layer. Capacitor stacks were formed wherein the conductive molybdenum oxide layer was formed at a pressure in the range of about 0.25 Torr to about 0.50 Torr. The ozone pulse was varied from 30 seconds to 90 seconds to test the sensitivity of the device performance to the ozone pulse time. Table 2 presents data that compares the measured EOT values and the leakage current density for the various capacitor stacks. The data indicate that low values of EOT and the leakage current density (e.g. both are evidence of a high k value of the dielectric layer) can be obtained using a high temperature, low pressure deposition for the conductive molybdenum oxide portion of the first electrode layer over a wide range of ozone pulse times.

TABLE 2

| Ozone pulse time (sec) | EOT (nm) | J at 1.0 V (A/cm$^2$) | K-value |
|---|---|---|---|
| 30 | 0.63 | 9.70E−8 | 49.0 |
| 45 | 0.61 | 2.69E−7 | 50.5 |
| 60 | 0.59 | 1.16E−7 | 51.9 |
| 90 | 0.61 | 1.10E−7 | 50.9 |

Figure 3:
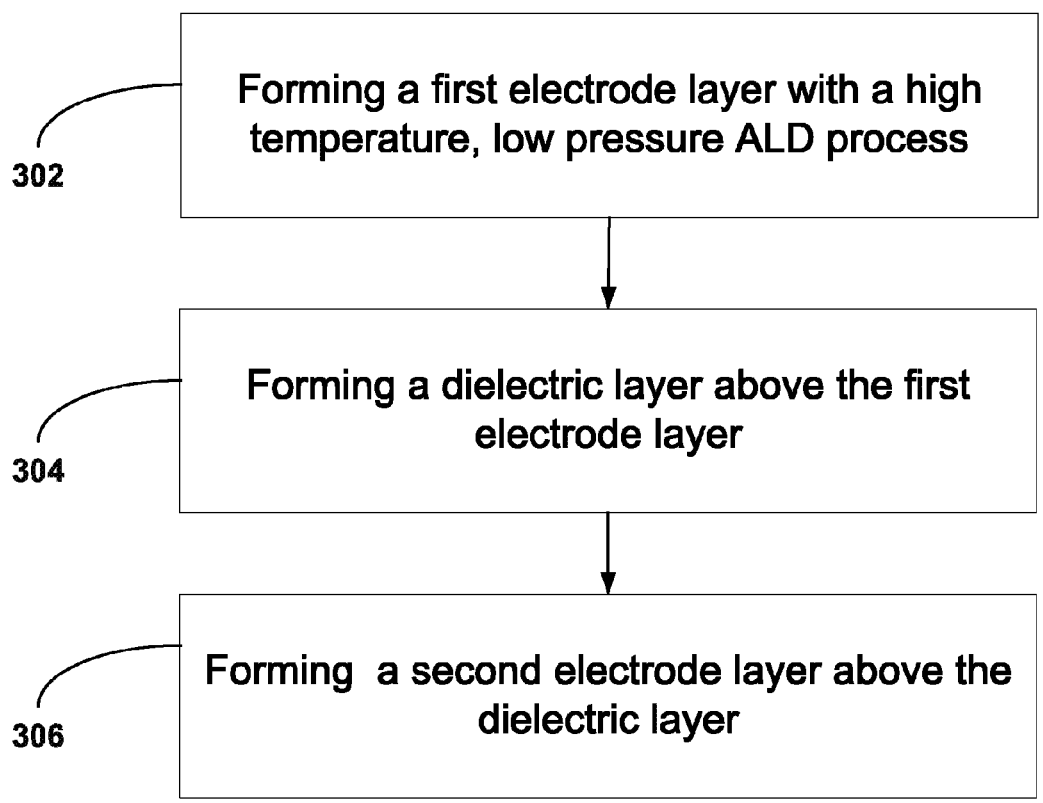
FIG. 3 illustrates a flow chart illustrating a method for fabricating a DRAM capacitor stack in accordance with some embodiments.

FIG. 3 describes a method, 300, for fabricating a DRAM capacitor stack. The initial step, 302, includes forming a first electrode layer above a substrate. Examples of suitable electrode materials include metals, conductive metal oxides, conductive metal silicides, conductive metal nitrides, and combinations thereof. A particularly interesting class of materials is the conductive metal oxides. The first electrode is formed using a high temperature, low pressure atomic layer deposition (ALD) process. The first electrode layer can then be subjected to an annealing process (not shown). The first electrode layer may include a single layer or may include multiple layers as discussed previously. The next step, 304, includes forming a dielectric layer above the first electrode layer. Optionally, the dielectric layer can then be subjected to a post dielectric anneal (PDA) treatment (not shown). The PDA step serves to crystallize the dielectric layer and fill oxygen vacancies. The next step, 306, includes forming a second electrode layer on the dielectric layer. The second electrode layer may include a single layer or may include multiple layers as discussed previously. Examples of suitable electrode materials include metals, conductive metal oxides, conductive metal silicides, conductive metal nitrides, and combinations thereof. Optionally, the capacitor stack can then be subjected to PMA treatment process in an oxidizing atmosphere, wherein the oxidizing atmosphere includes between 0% $O_2$ to 20% $O_2$ and at temperatures between 300 C to 600 C for between 1 millisecond to 60 minutes (not shown). Examples of the PDA and PMA treatments are further described in U.S. application Ser. No. 13/159,842 filed on Jun. 14, 2011, entitled "METHOD OF PROCESSING MIM CAPACITORS TO REDUCE LEAKAGE CURRENT" and is incorporated herein by reference for all purposes. Those skilled in the art will understand that other layers may be included in the capacitor stack.

Figure 4:
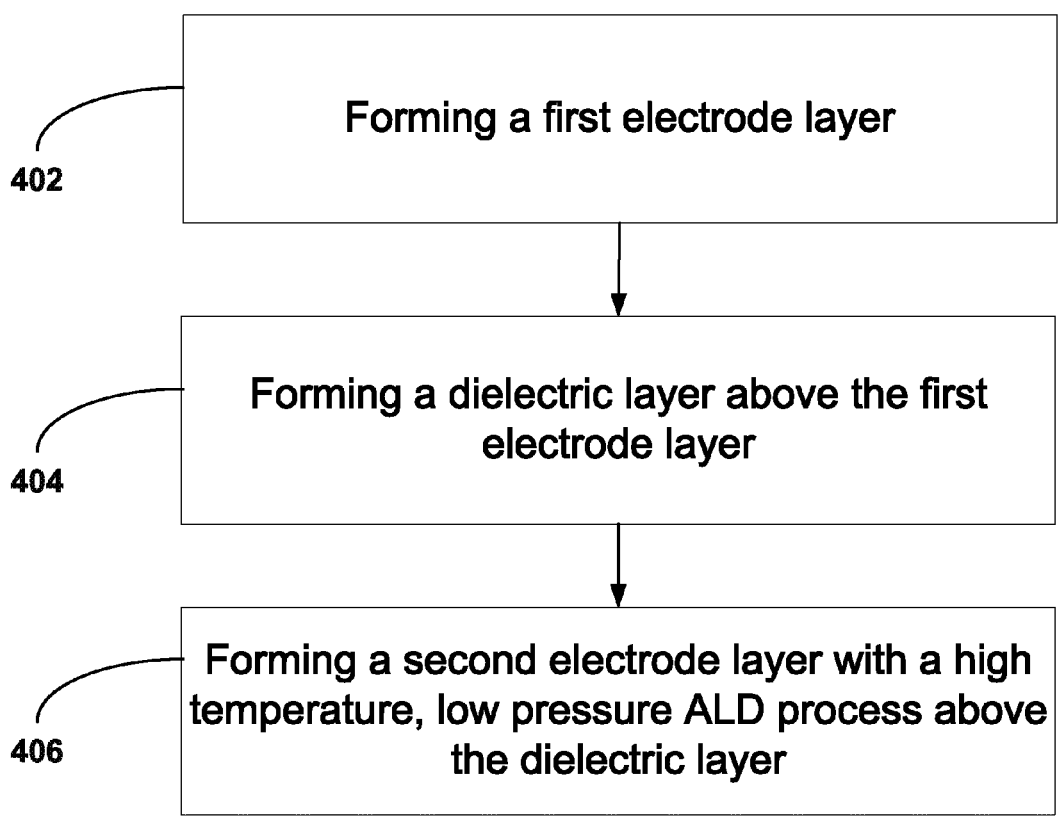
FIG. 4 illustrates a flow chart illustrating a method for fabricating a DRAM capacitor stack in accordance with some embodiments.

FIG. 4 describes a method, 400, for fabricating a DRAM capacitor stack. The initial step, 402, includes forming a first electrode layer above a substrate. The first electrode layer may include a single layer or may include multiple layers as discussed previously. The next step, 404, includes forming a dielectric layer above the first electrode layer. Optionally, the dielectric layer can then be subjected to a PDA treatment (not shown). The PDA step serves to crystallize the dielectric layer and fill oxygen vacancies. The next step, 406, includes forming a second electrode layer above the dielectric layer. The second electrode layer may include a single layer or may include multiple layers as discussed previously. Examples of suitable second electrode materials include metals, conductive metal oxides, conductive metal silicides, conductive metal nitrides, and combinations thereof. A particularly interesting class of materials is the conductive metal oxides. The second electrode layer is formed using a high temperature, low pressure ALD process. Optionally, the capacitor stack can then be subjected to PMA treatment process in an oxidizing atmosphere, wherein the oxidizing atmosphere includes between 0% $O_2$ to 20% $O_2$ and at temperatures between 300 C to 600 C for between 1 millisecond to 60 minutes (not shown). Those skilled in the art will understand that other layers may be included in the capacitor stack.

Figure 5:
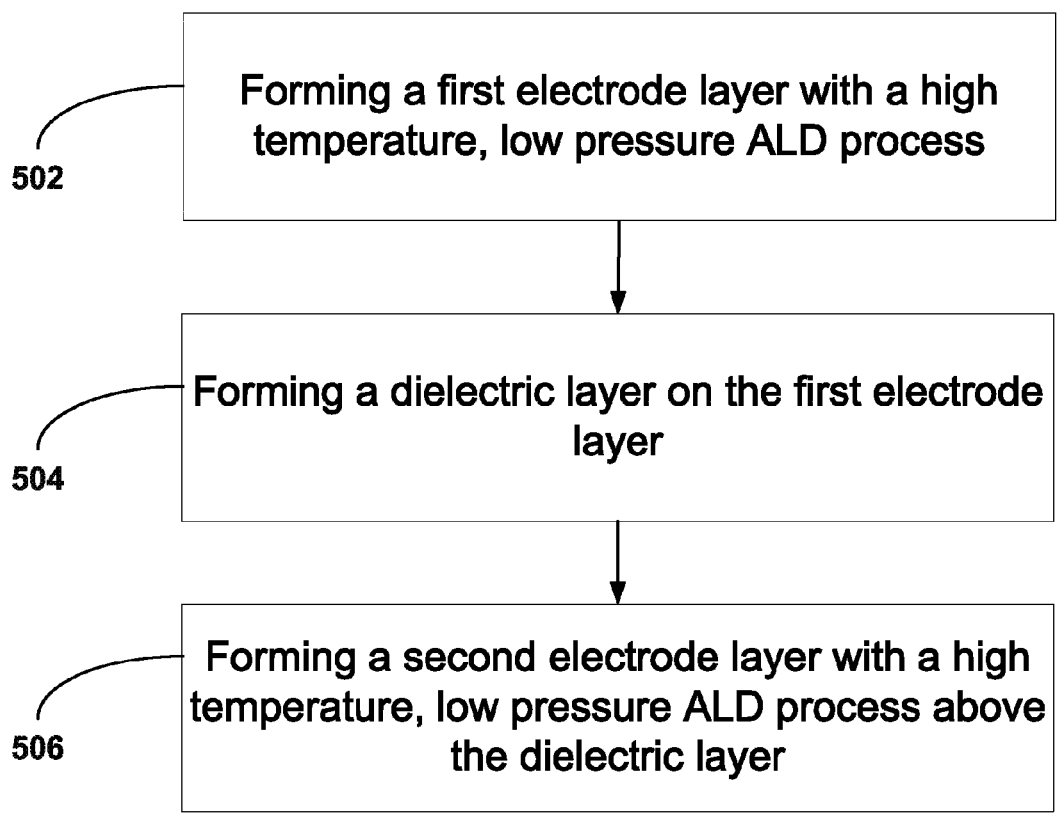
FIG. 5 illustrates a flow chart illustrating a method for fabricating a DRAM capacitor stack in accordance with some embodiments.

FIG. 5 describes a method, 500, for fabricating a DRAM capacitor stack. The initial step, 502, includes forming a first electrode layer above a substrate. The first electrode layer may include a single layer or may include multiple layers as discussed previously. Examples of suitable electrode materials include metals, conductive metal oxides, conductive metal silicides, conductive metal nitrides, and combinations thereof. A particularly interesting class of materials is the conductive metal oxides. The first electrode layer is formed using a high temperature, low pressure ALD process. The first electrode layer can then be subjected to an annealing process (not shown). The next step, 504, includes forming a dielectric layer above the first electrode layer. Optionally, the dielectric layer can then be subjected to a PDA treatment (not shown). The PDA step serves to crystallize the dielectric layer and fill oxygen vacancies. The next step, 506, includes forming a second electrode layer above the dielectric layer. The second electrode layer may include a single layer or may include multiple layers as discussed previously. Examples of suitable second electrode materials include metals, conductive metal oxides, conductive metal silicides, conductive metal nitrides, and combinations thereof. A particularly interesting class of materials is the conductive metal oxides. The second electrode layer is formed using a high temperature, low pressure ALD process. Optionally, the capacitor stack can then be subjected to PMA treatment process in an oxidizing atmosphere, wherein the oxidizing atmosphere includes between 0% $O_2$ to 20% $O_2$ and at temperatures between 300 C to 600 C for between 1 millisecond to 60 minutes (not shown). Those skilled in the art will understand that other layers may be included in the capacitor stack.

Those skilled in the art will appreciate that the formation of each of the first electrode layer, the dielectric layer, and the second electrode structure used in the MIM DRAM capacitor has been described using a generic ALD process. However, any of the variants of the generic ALD process may also be implemented. Common variants include plasma enhanced atomic layer deposition (PE-ALD), atomic vapor deposition (AVD), and ultraviolet assisted atomic layer deposition (UV-ALD), etc. Generally, because of the complex morphology of the DRAM capacitor structure, ALD, PE-ALD, AVD, or UV-ALD are preferred methods of formation. However, any of these techniques are suitable for forming each of the various layers discussed herein. Those skilled in the art will appreciate that the teachings described herein are not limited by the variant of the ALD technology used for the deposition process.

In FIGS. 6-10 below, a capacitor stack is illustrated using a simple planar structure. Those skilled in the art will appreciate that the description and teachings to follow can be readily applied to any simple or complex capacitor morphology. The drawings are for illustrative purposes only and do not limit the application of the present invention.

Figure 6:
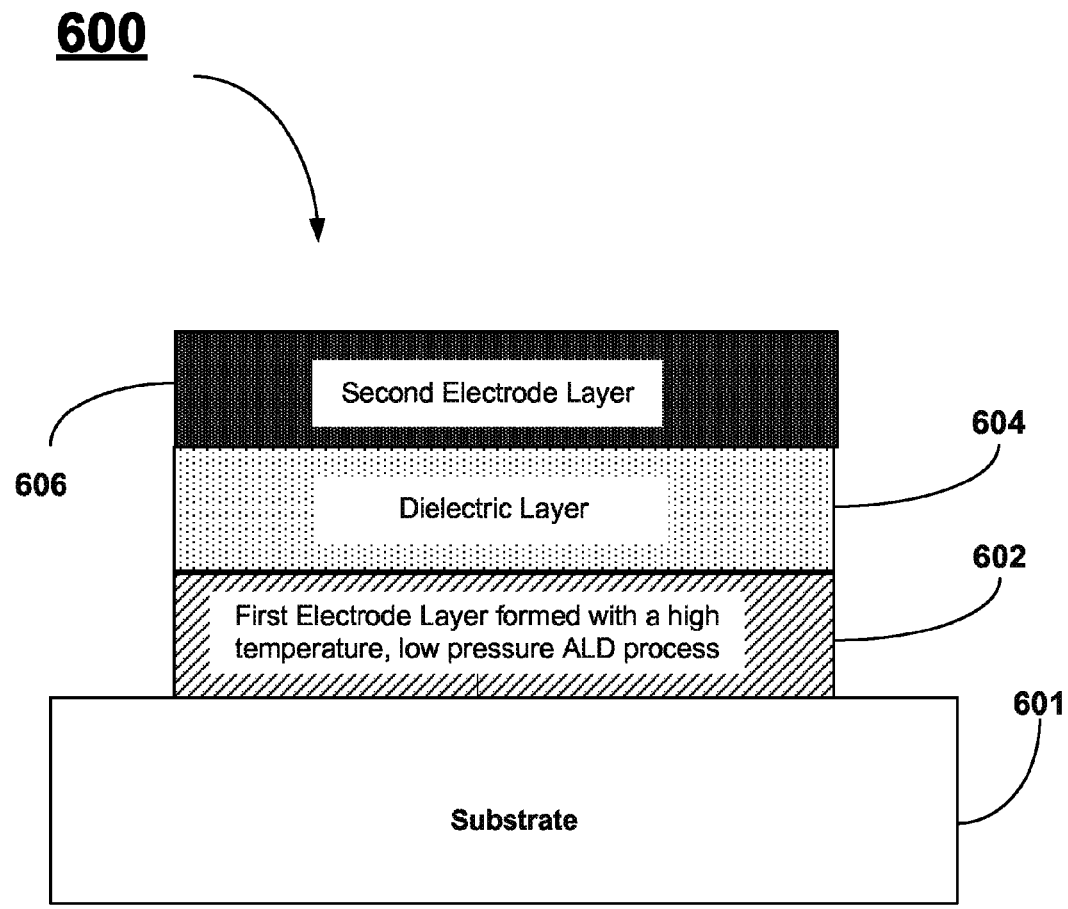
FIG. 6 illustrates a simplified cross-sectional view of a DRAM capacitor stack fabricated in accordance with some embodiments.

FIG. 6 illustrates a simple capacitor stack, 600, consistent with some embodiments. Using the method as outlined in FIG. 3 and described previously, first electrode layer, 602, is formed above substrate, 601. Generally, the substrate has already received several processing steps in the manufacture of a full DRAM device. First electrode layer, 602, includes one of metals, conductive metal oxides, conductive metal nitrides, conductive metal silicides, etc. The first electrode layer may include a single layer or may include multiple layers as discussed previously. In some embodiments, the first electrode layer includes a conductive metal oxide. The conductive metal oxide portion of the first electrode is formed using a high temperature, low pressure ALD process as discussed previously. In some embodiments, the first electrode layer may include at least one of the conductive compounds of molybdenum oxide, tungsten oxide, ruthenium oxide, iridium oxide, chromium oxide, manganese oxide, or tin oxide. Specific conductive metal oxide materials of interest are the conductive metal compounds of molybdenum oxide, ruthenium oxide, manganese oxide, tungsten oxide, and tin oxide. In some embodiments, the first electrode layer includes a conductive base layer formed under the conductive metal oxide. In some embodiments, the conductive base layer includes one of ruthenium, platinum, titanium nitride, tantalum nitride, titanium-aluminum-nitride, tungsten, tungsten nitride, molybdenum, molybdenum nitride, or vanadium nitride. The first electrode layer, 602, can be annealed to crystallize the material.

In the next step, dielectric layer, 604, would then be formed above the first electrode layer, 602. A wide variety of dielectric materials have been targeted for use in DRAM capacitors. Examples of suitable dielectric materials include aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide or doped versions of the same. As used herein, a "dopant" is a minor constituent (generally <20 atomic %) of a layer or material that is purposely added. As used herein, the dopant may be electrically active or not electrically active. The definition excludes residues and impurities such as carbon, etc. that may be present in the material due to inefficiencies of the process or impurities in the precursor materials. These dielectric materials may be formed as a single layer or may be formed as a hybrid or nanolaminate structure. In some embodiments, the dielectric layer is doped $TiO_2$. Typical dopants for titanium oxide include Al, Ce, Co, Er, Ga, Gd, Ge, Hf, In, La, Lu, Mg, Mn, Nd, Pr, Sc, Si, Sn, Sr, Y, Zr, or combinations thereof. Typically, dielectric layer, 604, is subjected to a PDA treatment before the formation of the second electrode layer as discussed previously.

In the next step, the second electrode layer, 606, is formed above dielectric layer, 604. The second electrode layer includes one of metals, conductive metal oxides, conductive metal nitrides, conductive metal silicides, conductive metal carbides, etc. Typically, the capacitor stack would then be subjected to a PMA treatment in an oxidizing atmosphere, wherein the oxidizing atmosphere includes between 0% $O_2$ to 20% $O_2$ and at temperatures between 300 C to 600 C for between 1 millisecond to 60 minutes. Those skilled in the art will understand that other layers may be included in the capacitor stack.

Figure 7:
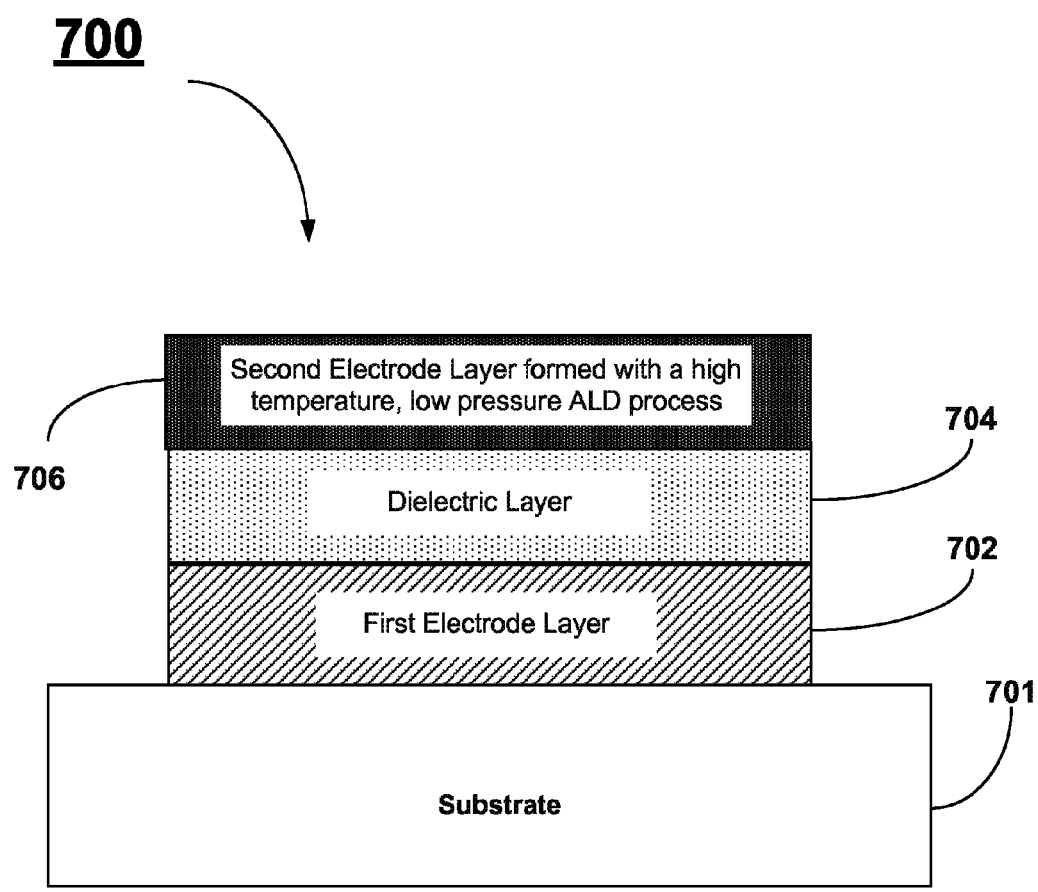
FIG. 7 illustrates a simplified cross-sectional view of a DRAM capacitor stack fabricated in accordance with some embodiments.

FIG. 7 illustrates a simple capacitor stack, 700, consistent with some embodiments. Using the method as outlined in FIG. 4 and described above, first electrode layer, 702, is formed above substrate, 701. Generally, the substrate has already received several processing steps in the manufacture of a full DRAM device. First electrode layer, 702, includes one of metals, conductive metal oxides, conductive metal nitrides, conductive metal silicides, etc. The first electrode layer may include a single layer or may include multiple layers as discussed previously. In some embodiments, the conductive metal oxide portion of the first electrode layer is a conductive metal oxide. In some embodiments, the first electrode layer may include at least one of the conductive compounds of molybdenum oxide, tungsten oxide, ruthenium oxide, iridium oxide, chromium oxide, manganese oxide, or tin oxide. Specific conductive metal oxide materials of interest are the conductive metal compounds of molybdenum oxide, ruthenium oxide, manganese oxide, tungsten oxide, and tin oxide. In some embodiments, the first electrode layer includes a conductive base layer formed under the conductive metal oxide. In some embodiments, the conductive base layer includes one of ruthenium, platinum, titanium nitride, tantalum nitride, titanium-aluminum-nitride, tungsten, tungsten nitride, molybdenum, molybdenum nitride, or vanadium nitride. The first electrode layer, 702, can be annealed to crystallize the material.

In the next step, dielectric layer, 704, would then be formed above the first electrode layer, 702. A wide variety of dielectric materials have been targeted for use in DRAM capacitors.

Examples of suitable dielectric materials include aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide or doped versions of the same. These dielectric materials may be formed as a single layer or may be formed as a hybrid or nanolaminate structure. In some embodiments, the dielectric layer is doped titanium oxide. Typical dopants for titanium oxide include Al, Ce, Co, Er, Ga, Gd, Ge, Hf, In, La, Lu, Mg, Mn, Nd, Pr, Sc, Si, Sn, Sr, Y, Zr, or combinations thereof. Typically, dielectric layer, 704, is subjected to a PDA treatment before the formation of the second electrode layer as discussed previously.

In the next step, the second electrode layer, 706, is formed above dielectric layer, 704. The second electrode layer includes one of metals, conductive metal oxides, conductive metal nitrides, conductive metal silicides, conductive metal carbides, etc. The second electrode layer may include a single layer or may include multiple layers as discussed previously. In some embodiments, the conductive metal oxide portion of the second electrode layer is a conductive metal oxide. In some embodiments, the second electrode layer may include at least one of the conductive compounds of molybdenum oxide, tungsten oxide, ruthenium oxide, iridium oxide, chromium oxide, manganese oxide, or tin oxide. Specific conductive metal oxide materials of interest are the conductive metal compounds of molybdenum oxide, ruthenium oxide, manganese oxide, tungsten oxide, and tin oxide. In some embodiments, the second electrode layer includes a conductive base layer formed above the conductive metal oxide. In some embodiments, the conductive base layer includes one of ruthenium, platinum, titanium nitride, tantalum nitride, titanium-aluminum-nitride, tungsten, tungsten nitride, molybdenum, molybdenum nitride, or vanadium nitride. The conductive metal oxide portion of the second electrode is formed using a high temperature, low pressure ALD process as discussed previously. Typically, the capacitor stack would then be subjected to a PMA treatment in an oxidizing atmosphere, wherein the oxidizing atmosphere includes between 0% $O_2$ to 20% $O_2$ and at temperatures between 300 C to 600 C for between 1 millisecond to 60 minutes. Those skilled in the art will understand that other layers may be included in the capacitor stack.

Figure 8:
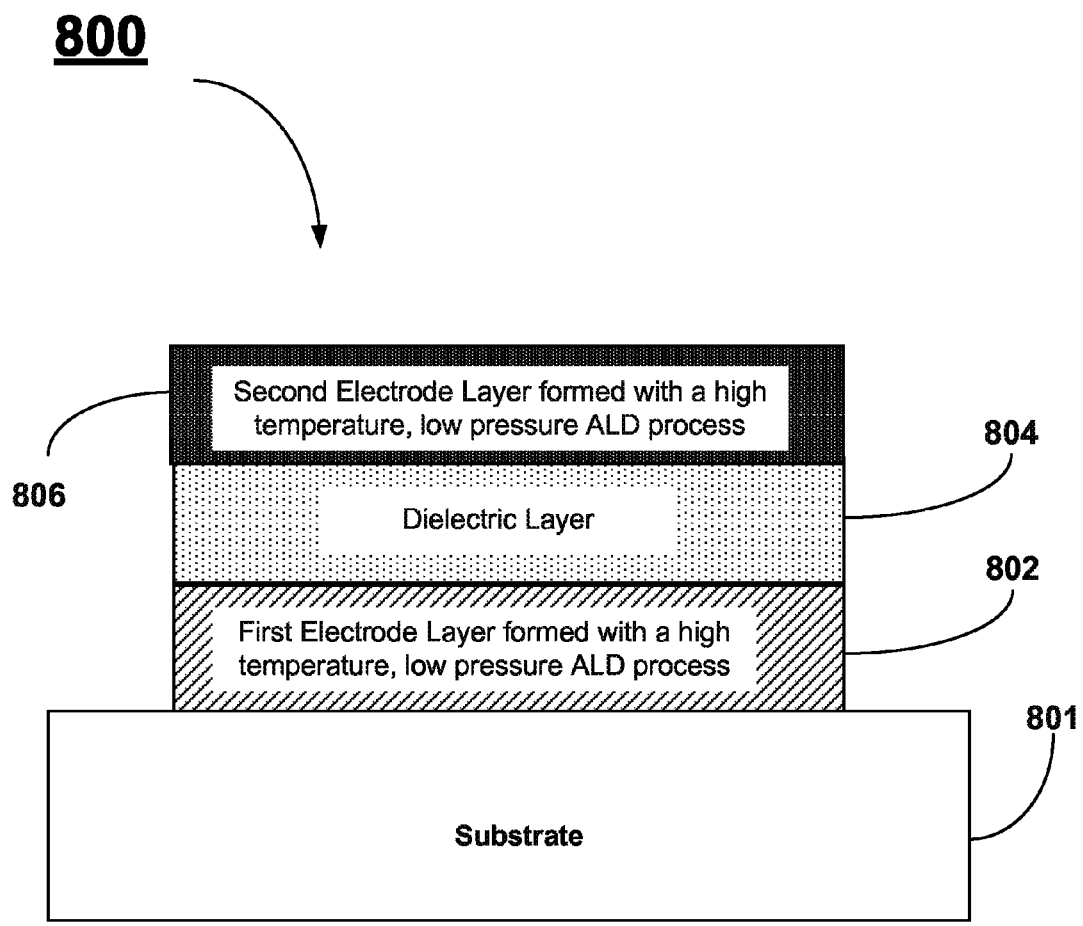
FIG. 8 illustrates a simplified cross-sectional view of a DRAM capacitor stack fabricated in accordance with some embodiments.

FIG. 8 illustrates a simple capacitor stack, 800, consistent with some embodiments. Using the method as outlined in FIG. 5 and described above, first electrode layer, 802, is formed above substrate, 801. Generally, the substrate has already received several processing steps in the manufacture of a full DRAM device. First electrode layer, 802, includes one of metals, conductive metal oxides, conductive metal nitrides, conductive metal silicides, etc. The first electrode layer may include a single layer or may include multiple layers as discussed previously. In some embodiments, the first electrode layer includes a conductive metal oxide. The conductive metal oxide portion of the first electrode is formed using a high temperature, low pressure ALD process as discussed previously. In some embodiments, the first electrode layer may include at least one of the conductive compounds of molybdenum oxide, tungsten oxide, ruthenium oxide, iridium oxide, chromium oxide, manganese oxide, or tin oxide. Specific conductive metal oxide materials of interest are the conductive metal compounds of molybdenum oxide, ruthenium oxide, manganese oxide, tungsten oxide, and tin oxide. In some embodiments, the first electrode layer includes a conductive base layer formed under the conductive metal oxide. In some embodiments, the conductive base layer includes one of ruthenium, platinum, titanium nitride, tantalum nitride, titanium-aluminum-nitride, tungsten, tungsten nitride, molybdenum, molybdenum nitride, or vanadium nitride. The first electrode, 802, can be annealed to crystallize the material.

In the next step, dielectric layer, 804, would then be formed above the first electrode layer, 802. A wide variety of dielectric materials have been targeted for use in DRAM capacitors. Examples of suitable dielectric materials include aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide or doped versions of the same. These dielectric materials may be formed as a single layer or may be formed as a hybrid or nanolaminate structure. In some embodiments, the dielectric layer is doped titanium oxide. Typical dopants for titanium oxide include Al, Ce, Co, Er, Ga, Gd, Ge, Hf, In, La, Lu, Mg, Mn, Nd, Pr, Sc, Si, Sn, Sr, Y, Zr, or combinations thereof. Typically, dielectric layer, 804, is subjected to a PDA treatment before the formation of the second electrode layer as discussed previously.

In the next step, the second electrode layer, 806, is formed above dielectric layer, 804. The second electrode layer includes one of metals, conductive metal oxides, conductive metal nitrides, conductive metal silicides, conductive metal carbides, etc. The second electrode layer may include a single layer or may include multiple layers as discussed previously. In some embodiments, the conductive metal oxide portion of the second electrode layer is a conductive metal oxide. In some embodiments, the second electrode layer may include at least one of the conductive compounds of molybdenum oxide, tungsten oxide, ruthenium oxide, iridium oxide, chromium oxide, manganese oxide, or tin oxide. Specific conductive metal oxide materials of interest are the conductive metal compounds of molybdenum oxide, ruthenium oxide, manganese oxide, tungsten oxide, and tin oxide. In some embodiments, the second electrode layer includes a conductive base layer formed above the conductive metal oxide. In some embodiments, the conductive base layer includes one of ruthenium, platinum, titanium nitride, tantalum nitride, titanium-aluminum-nitride, tungsten, tungsten nitride, molybdenum, molybdenum nitride, or vanadium nitride. The conductive metal oxide portion of the second electrode is formed using a high temperature, low pressure ALD process as discussed previously. Typically, the capacitor stack would then be subjected to a PMA treatment in an oxidizing atmosphere, wherein the oxidizing atmosphere includes between 0% $O_2$ to 20% $O_2$ and at temperatures between 300 C to 600 C for between 1 millisecond to 60 minutes. Those skilled in the art will understand that other layers may be included in the capacitor stack.

Figure 9:
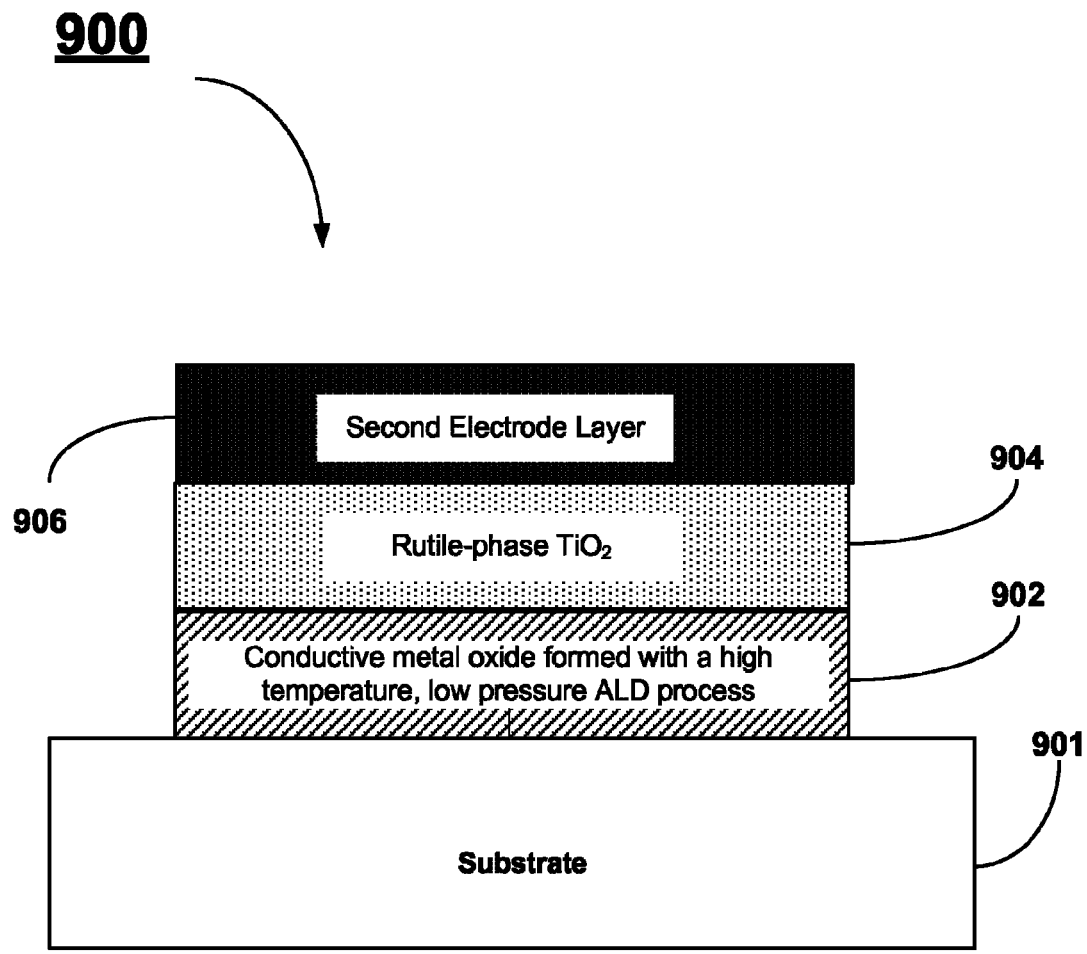
FIG. 9 illustrates a simplified cross-sectional view of a DRAM capacitor stack fabricated in accordance with some embodiments.

FIG. 9 illustrates a simple capacitor stack, 900, consistent with some embodiments. Using the method as outlined in FIG. 3 and described above, first electrode layer, 902, is formed above substrate, 901. Generally, the substrate has already received several processing steps in the manufacture of a full DRAM device. First electrode layer, 902, includes one of metals, conductive metal oxides, conductive metal nitrides, conductive metal silicides, conductive metal carbides, etc. For this example, first electrode layer, 902, includes a conductive metal oxide that may serve to promote the rutile phase of titanium oxide. The first electrode layer may include a single layer or may include multiple layers as discussed previously. In some embodiments, the first electrode layer includes a conductive metal oxide. The conductive metal oxide portion of the first electrode is formed using a high temperature, low pressure ALD process as discussed previously. In some embodiments, the first electrode layer may include at least one of the conductive compounds of molybdenum oxide, tungsten oxide, ruthenium oxide, iridium oxide, chromium oxide, manganese oxide, or tin oxide. Specific conductive metal oxide materials of interest are the conductive metal compounds of molybdenum oxide, ruthenium oxide, manganese oxide, tungsten oxide, and tin oxide. In some embodiments, the first electrode layer includes a conductive base layer formed under the conductive metal oxide. In some embodiments, the conductive base layer includes one of ruthenium, platinum, titanium nitride, tantalum nitride, titanium-aluminum-nitride, tungsten, tungsten nitride, molybdenum, molybdenum nitride, or vanadium nitride.

Optionally, first electrode, 902, can be annealed to crystallize the material. In the case of crystalline conductive molybdenum oxide, it is advantageous to anneal the first electrode layer in a reducing atmosphere to prevent the formation of oxygen-rich compounds as discussed previously.

In some embodiments, a first electrode layer including between about 5 nm and about 15 nm of conductive molybdenum oxide is formed on a substrate (or on a titanium nitride base layer). The conductive molybdenum oxide electrode layer is formed at a process temperature between about 280 C and about 360 C and a pressure between about 0.10 Torr and about 1.00 Torr using an ALD process technology. Optionally, the substrate with the first electrode layer is then annealed in a reducing atmosphere including between about 0% and about 10% $H_2$ in $N_2$ or other inert gases and advantageously between about 5% and about 10% $H_2$ in $N_2$ or other inert gases between about 400 C and about 650 C for between about 1 millisecond and about 60 minutes.

In the next step, dielectric layer, 904, would then be formed above the first electrode layer, 902. A wide variety of dielectric materials have been targeted for use in DRAM capacitors. Examples of suitable dielectric materials include aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide or doped versions of the same. These dielectric materials may be formed as a single layer or may be formed as a hybrid or nanolaminate structure. Typically, dielectric layer, 904, is subjected to a PDA treatment before the formation of the second electrode as discussed previously. In some embodiments, the dielectric layer is doped titanium oxide. Typical dopants for titanium oxide include Al, Ce, Co, Er, Ga, Gd, Ge, Hf, In, La, Lu, Mg, Mn, Nd, Pr, Sc, Si, Sn, Sr, Y, Zr, or combinations thereof. A dielectric material of interest is $TiO_2$ doped with Al to between about 5 atomic % and about 15 atomic % Al. The rutile phase of $TiO_2$ will form preferentially on the underlying conductive molybdenum oxide electrode layer resulting in a higher k value.

In some embodiments, the dielectric layer includes between about 6 nm to about 10 nm of titanium oxide wherein at least 30% of the titanium oxide is present in the rutile phase. Generally, the titanium oxide dielectric layer may either be a single film or may include a nanolaminate. Advantageously, the titanium oxide material is doped with Al at a concentration between about 5 atomic % and about 15 atomic %. The titanium oxide dielectric layer is formed at a process temperature between about 200 C and 350 C using an ALD process technology. The substrate with the first electrode layer and dielectric layer is then annealed in an oxidizing atmosphere including between about 0% $O_2$ to about 100% $O_2$ in $N_2$ and advantageously between about 0% $O_2$ to about 20% $O_2$ in $N_2$ at temperatures between about 300 C to about 600 C for between about 1 millisecond to about 60 minutes.

Second electrode layer, 906, is then formed above dielectric layer, 904. The second electrode layer may include a single layer or may include multiple layers as discussed previously. In some embodiments, the second electrode layer is typically a metal such as ruthenium, platinum, titanium nitride, tantalum nitride, titanium-aluminum-nitride, tungsten, tungsten nitride, molybdenum, molybdenum nitride, vanadium nitride, or others. In some embodiments, the conductive metal oxide portion of the second electrode layer is a conductive metal oxide. In some embodiments, the second electrode layer may include at least one of the conductive compounds of molybdenum oxide, tungsten oxide, ruthenium oxide, iridium oxide, chromium oxide, manganese oxide, or tin oxide. Specific conductive metal oxide materials of interest are the conductive metal compounds of molybdenum oxide, ruthenium oxide, manganese oxide, tungsten oxide, and tin oxide. In some embodiments, the second electrode layer includes a conductive base layer formed above the conductive metal oxide. In some embodiments, the conductive base layer includes one of ruthenium, platinum, titanium nitride, tantalum nitride, titanium-aluminum-nitride, tungsten, tungsten nitride, molybdenum, molybdenum nitride, or vanadium nitride. The conductive metal oxide portion of the second electrode is formed using a high temperature, low pressure ALD process as discussed previously. Advantageously, the conductive metal oxide portion of the second electrode is molybdenum oxide. The second electrode is typically between about 5 nm and 50 nm in thickness. Typically, the capacitor stack would then be subjected to a PMA treatment in an oxidizing atmosphere, wherein the oxidizing atmosphere includes between 0% $O_2$ to 20% $O_2$ and at temperatures between 300 C to 600 C for between 1 millisecond to 60 minutes. The PMA treatment serves to crystallize the second electrode and to anneal defects and interface states that are formed at the dielectric/second electrode interface during the deposition. Those skilled in the art will understand that other layers may be included in the capacitor stack.

Figure 10:
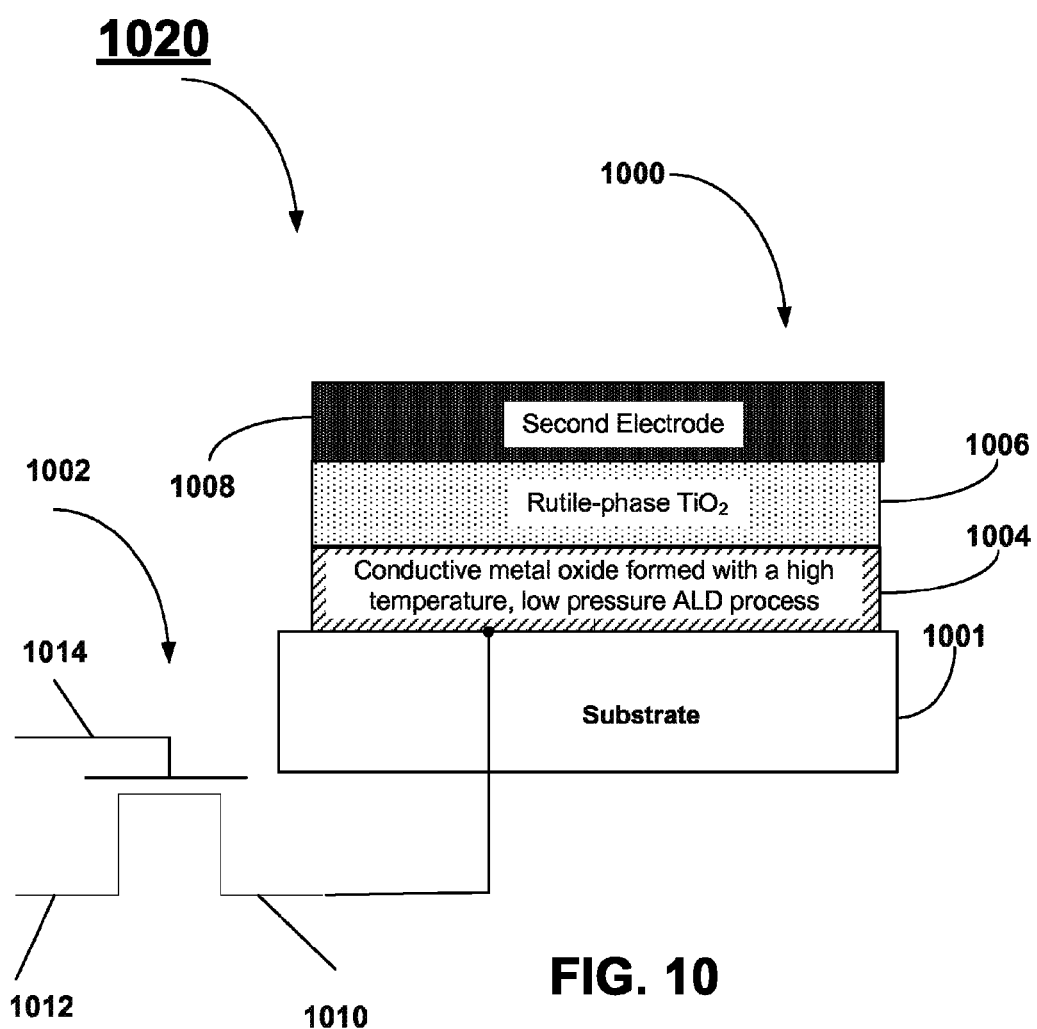
FIG. 10 illustrates a simplified cross-sectional view of a DRAM memory cell fabricated in accordance with some embodiments.

An example of a specific application of some embodiments is in the fabrication of capacitors used in the memory cells in DRAM devices. DRAM memory cells effectively use a capacitor to store charge for a period of time, with the charge being electronically "read" to determine whether a logical "one" or "zero" has been stored in the associated cell. Conventionally, a cell transistor is used to access the cell. The cell transistor is turned "on" in order to store data on each associated capacitor and is otherwise turned "off" to isolate the capacitor and preserve its charge. More complex DRAM cell structures exist, but this basic DRAM structure will be used for illustrating the application of this disclosure to capacitor manufacturing and to DRAM manufacturing. FIG. 10 is used to illustrate one DRAM cell, 1020, manufactured using a first electrode structure as discussed previously. The cell, 1020, is illustrated schematically to include two principle components, a cell capacitor, 1000, and a cell transistor, 1002. The cell transistor is usually constituted by a MOS transistor having a gate, 1014, source, 1010, and drain, 1012. The gate is usually connected to a word line and one of the source or drain is connected to a bit line. The cell capacitor has a lower or storage electrode and an upper or plate electrode. The storage electrode is connected to the other of the source or drain and the plate electrode is connected to a reference potential conductor. The cell transistor is, when selected, turned "on" by an active level of the word line to read or write data from or into the cell capacitor via the bit line.

As was described previously in connection with FIG. 9, the cell capacitor, 1000, includes a first electrode layer, 1004, formed above substrate, 1001. The first electrode layer, 1004, is connected to the source or drain of the cell transistor, 1002. For illustrative purposes, the first electrode layer has been connected to the source, 1010, in this example. For the purposes of illustration, first electrode layer, 1004, will include a conductive metal oxide (i.e. conductive molybdenum oxide in this example) formed using a high temperature, low pressure ALD process as described previously. The first electrode layer may include a single layer or may include multiple layers as discussed previously. In some embodiments, the first electrode layer may include at least one of the conductive compounds of molybdenum oxide, tungsten oxide, ruthenium oxide, iridium oxide, chromium oxide, manganese oxide, or tin oxide. Specific conductive metal oxide materials of interest are the conductive metal compounds of molybdenum oxide, ruthenium oxide, manganese oxide, tungsten oxide, and tin oxide. In some embodiments, the first electrode layer includes a conductive base layer formed under the conductive metal oxide. In some embodiments, the conductive base layer includes one of ruthenium, platinum, titanium nitride, tantalum nitride, titanium-aluminum-nitride, tungsten, tungsten nitride, molybdenum, molybdenum nitride, or vanadium nitride. As discussed previously, first electrode layer, 1004, may be subjected to an anneal in a reducing atmosphere before the formation of the dielectric layer to crystallize the conductive metal oxide and to reduce any oxygen-rich compounds that may have formed during the formation of the first electrode layer. Dielectric layer, 1006, is formed above the first electrode layer. For the purposes of illustration, dielectric layer, 1006, will be rutile-phase titanium oxide. As discussed previously, the titanium oxide may be doped. Typical dopants for titanium oxide include Al, Ce, Co, Er, Ga, Gd, Ge, Hf, In, La, Lu, Mg, Mn, Nd, Pr, Sc, Si, Sn, Sr, Y, Zr, or combinations thereof. Typically, the dielectric layer is then subjected to a PDA treatment. The second electrode layer, 1008, is then formed above the dielectric layer. The second electrode layer may include a single layer or may include multiple layers as discussed previously. In some embodiments, the second electrode layer is typically a metal such as ruthenium, platinum, titanium nitride, tantalum nitride, titanium-aluminum-nitride, tungsten, tungsten nitride, molybdenum, molybdenum nitride, vanadium nitride, or others. In some embodiments, the conductive metal oxide portion of the second electrode layer is a conductive metal oxide. In some embodiments, the second electrode layer may include at least one of the conductive compounds of molybdenum oxide, tungsten oxide, ruthenium oxide, iridium oxide, chromium oxide, manganese oxide, or tin oxide. Specific conductive metal oxide materials of interest are the conductive metal compounds of molybdenum oxide, ruthenium oxide, manganese oxide, tungsten oxide, and tin oxide. In some embodiments, the second electrode layer includes a conductive base layer formed above the conductive metal oxide. In some embodiments, the conductive base layer includes one of ruthenium, platinum, titanium nitride, tantalum nitride, titanium-aluminum-nitride, tungsten, tungsten nitride, molybdenum, molybdenum nitride, or vanadium nitride. The conductive metal oxide portion of the second electrode is formed using a high temperature, low pressure ALD process as discussed previously. Advantageously, the conductive metal oxide portion of the second electrode is molybdenum oxide. Typically, the capacitor stack would then be subjected to a PMA treatment in an oxidizing atmosphere, wherein the oxidizing atmosphere includes between 0% $O_2$ to 20% $O_2$ and at temperatures between 300 C to 600 C for between 1 millisecond to 60 minutes. This completes the formation of the capacitor stack. Those skilled in the art will understand that other layers may be included in the capacitor stack.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A semiconductor layer stack comprising:
   a first electrode layer formed above a substrate;
   a dielectric layer formed above the first electrode layer; and
   a second electrode layer formed above the dielectric layer;
   wherein the first electrode layer comprises molybdenum oxide having a distorted rutile structure,
   wherein the first electrode layer is a continuous layer having a surface roughness of less than 10A, and
   wherein the dielectric layer comprises a dielectric material having a rutile phase.

2. The semiconductor layer stack of claim 1, wherein the first electrode layer further comprises one of ruthenium, platinum, titanium nitride, tantalum nitride, titanium aluminum-nitride, tungsten, tungsten nitride, molybdenum, molybdenum nitride, or vanadium nitride.

3. The semiconductor layer stack of claim 1, wherein the dielectric material comprises one of aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide or doped versions of the same.

4. The semiconductor layer stack of claim 3, wherein the dielectric material comprises titanium oxide.

5. The semiconductor layer stack of claim 3, wherein the dielectric material further comprises a dopant, the dopant comprising at least one of Al, Ce, Co, Er, Ga, Gd, Ge, Hf, In, La, Lu, Mg, Mn, Nd, Pr, Sc, Si, Sn, Sr, Y, or Zr.

6. The semiconductor layer stack of claim 1, wherein the second electrode layer comprises one of ruthenium, platinum, titanium nitride, tantalum nitride, titanium aluminum nitride, tungsten, tungsten nitride, molybdenum, molybdenum nitride, or vanadium nitride.

7. The semiconductor layer stack of claim 6, wherein the second electrode layer comprises titanium nitride.

8. The semiconductor layer stack of claim 1, wherein the second electrode layer comprises one of molybdenum oxide, tungsten oxide, ruthenium oxide, iridium oxide, chromium oxide, manganese oxide, or tin oxide.

9. The semiconductor layer stack of claim 8, wherein the second electrode layer comprises molybdenum oxide.

10. The semiconductor layer stack of claim 1, wherein the first electrode layer further comprises titanium nitride, wherein titanium nitride and molybdenum oxide form a bi-layered structure of the first electrode layer.

11. The semiconductor layer stack of claim 10, wherein the dielectric material comprises titanium oxide.

12. The semiconductor layer stack of claim 11, wherein the dielectric material further comprises a dopant, the dopant comprising aluminum.

13. The semiconductor layer stack of claim 11, wherein the second electrode layer comprises platinum.

14. The semiconductor layer stack of claim 1, wherein the dielectric material further comprises a dopant, the dopant comprising aluminum.

15. The semiconductor layer stack of claim 14, wherein a concentration of the dopant in the dielectric material is between about 5 atomic % and 15 atomic %.

* * * * *